United States Patent
Son

(10) Patent No.: US 7,438,018 B2
(45) Date of Patent: Oct. 21, 2008

(54) CONFINEMENT RING ASSEMBLY OF PLASMA PROCESSING APPARATUS

(75) Inventor: Sung-Ku Son, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 47 days.

(21) Appl. No.: 11/452,338

(22) Filed: Jun. 14, 2006

(65) Prior Publication Data

US 2006/0283551 A1 Dec. 21, 2006

(30) Foreign Application Priority Data

Jun. 17, 2005 (KR) .................. 10-2005-0052197

(51) Int. Cl.
 *C23F 1/00* (2006.01)
(52) U.S. Cl. .................. 118/723 R; 156/345.28; 315/111.71
(58) Field of Classification Search ............ 315/111.71; 156/345.28
 See application file for complete search history.

(56) References Cited

U.S. PATENT DOCUMENTS

| | | | |
|---|---|---|---|
| 5,534,751 A | 7/1996 | Lenz et al. | |
| 6,008,130 A | 12/1999 | Henderson et al. | |
| 6,019,060 A * | 2/2000 | Lenz ................. | 118/723 R |
| 6,492,774 B1 | 12/2002 | Han et al. | |
| 6,527,911 B1 | 3/2003 | Yen et al. | |
| 6,823,815 B2 | 11/2004 | Han et al. | |
| 2003/0151371 A1 * | 8/2003 | Fischer et al. ......... | 315/111.21 |

* cited by examiner

*Primary Examiner*—Karla Moore
*Assistant Examiner*—Nathan K Ford
(74) *Attorney, Agent, or Firm*—Volentine & Whitt, PLLC

(57) ABSTRACT

A confinement ring assembly of a plasma treatment apparatus includes a cam ring disposed above the process chamber, a plurality of plungers disposed about a process chamber of the apparatus and operated by the cam ring, and a plurality of confinement rings coupled to the plungers. The plasma rings surround a plasma processing space in the process chamber. Each of the plungers includes a rod, a bearing block to which the rod is fixed and engaged with the cam ring such that the rod is moved up or down when the cam ring is rotated, a cylinder through which the rod extends, and a bushing fixed to the bottom of the cylinder. The confinement rings include an upper confinement ring fitted to the bushing of each of the plungers, and at least one lower confinement ring coupled to a lower end of the rod of each of the plungers. At least one lower confinement ring has an inner peripheral portion that extends upwardly to form a vertically extending inner wall. The inner wall confronts and is spaced from an inner side wall surface of at least one of the other confinement rings. Thus, the inner wall prevents plasma within the process chamber from penetrating into at least one gap between the confinement rings. Also, the inner wall presents an inner side wall surface having a relatively large surface area for polymer to cling to. Thus, the polymer is not likely to fall of the surface and thereby contaminate a substrate.

14 Claims, 8 Drawing Sheets

CONFINEMENT RING ASSEMBLY OF PLASMA PROCESSING APPARATUS

BACKGROUND OF THE INVENTION

1. Field of the Invention

The present invention relates to a plasma processing apparatus. More particularly, the present invention relates to an assembly of confinement rings of a plasma treatment apparatus.

2. Description of the Related Art

Plasma treatment apparatuses are widely used in the manufacturing of semiconductor devices for forming thin films on substrates and then etching the thin films to form patterns, such as circuit patterns. A typical plasma treatment apparatus generally includes a process chamber in which the substrate is processed, and an upper electrode and a lower electrode disposed in the process chamber. Plasma is formed between the upper electrode and the lower by impressing an RF power across the electrodes while injecting a process gas between the electrodes. The plasma treatment apparatus also includes confinement rings disposed in the process chamber around the space into which the process gas is injected. The confinement rings serve to confine the plasma so that the substrate will be processed, e.g., etched, efficiently by the plasma.

FIG. 1 shows a portion of a confinement ring assembly of a conventional plasma treatment apparatus. A cam ring 20 of the assembly is disposed above a cover of the process chamber 10. A driving means, namely a motor, is connected to the cam ring 20 so as to selectively rotate the cam ring 20. The confinement ring assembly also includes a plurality of plungers that are spaced from each other by equal angular intervals about the process chamber 10 and cooperate with the cam ring 20.

More specifically, the plungers (only one of which is shown) each comprise a roller 30 that contacts the cam ring 20 along the bottom (cam) surface of the cam ring 20. The roller 30 is thus moved upwardly or downwardly by the bottom surface of the cam ring 20 when the cam ring 20 is rotated by the motor. The axle of each roller 30 is fixed to a bearing block 40 such that the bearing block 40 moves vertically along with the roller 30.

The plungers also each comprise a rod 50, a cylinder 60 and a spring 61. The upper end of the rod 50 is engaged with the lower portion of a bearing block 40 so as to move therewith. The spring 61 is disposed within the cylinder 60. More specifically, a quad seal and an O-ring are mounted to the cylinder 60 within the lower end portion of the cylinder 60. The spring 61 surrounds the rod 50 above the quad seal and the O-ring and is interposed between the quad seal and a flange that is fixed to the rod 50. Thus, the spring biases the rod 50 upwardly and hence, the roller 30 is biased into engagement with the cam ring 20.

Furthermore, each plunger also includes a bushing 62 fitted to the lower portion of the cylinder 60. The rod 50 extends freely through the bushing 62 such that the rod 50 may move vertically relative to the bushing 62. A quartz ring 70 is engaged with the outer peripheral surface of the bushing 62 of each plunger. An upper confinement ring 80 is engaged with the bottom of the quartz ring 70 and is held in place by the bushings 62 such that the upper confinement ring 80 can not be separated from the quartz ring 70. A lower confinement ring 90 is coupled by nuts, for example, to the lower ends of the rods 50 under the upper confinement ring 80. Thus, the lower confinement ring 90 can be raised and lowered by the rods 50. The quartz ring 70, the upper confinement ring 80, and the lower confinement ring 90 generally have the same or similar inner and outer diameters, respectively.

The total number of confinement rings in the process chamber depends on the manufacturer. Regardless, as shown in FIG. 2, the confronting surfaces of the conventional confinement rings 80 and 90 are spaced from each other by a predetermined interval. Therefore, some of the plasma penetrates into this gap between the confinement rings 80 and 90, thereby sharply lowering the efficiency of the process.

Furthermore, a polymer byproduct of the plasma process accumulates on the side wall surfaces of the confinement rings 80 and 90. However, the side wall surfaces of the confinement rings 80 and 90 are not large enough for the polymer to adhere well to. Therefore, the polymer readily flakes off of the confinement rings 80 and 90 and thus, is a source of particulate contamination, i.e., lowers the quality of the product.

SUMMARY OF THE INVENTION

Accordingly, an object of the present invention is to solve the above-mentioned problems of the prior art.

More specifically, one object of the present invention is to provide a confinement ring assembly of a plasma processing apparatus which minimizes or prevents the loss of plasma between confinement rings of the assembly.

Another object of the present invention is to provide a confinement ring assembly of a plasma processing apparatus, which will not cause be a source of contamination for substrates processed in the apparatus.

A confinement ring assembly of a plasma processing apparatus has a plurality of plungers disposed about the process chamber of the apparatus, and a plurality of confinement rings supported by the plungers. Each of the plungers includes a fixed portion including a cylinder and a bushing mounted to a lower end of the cylinder, and a movable portion including a vertically movable rod that extends through the cylinder and bushing.

According to one aspect of the present invention, the confinement rings include an upper confinement ring fitted to the bushings of the plungers, and at least one lower confinement ring coupled to lower ends the rods of the plungers, wherein one or more of the lower confinement rings has an inner peripheral portion that extends upwardly to form a vertically extending inner wall. The vertically extending inner wall confronts and is spaced from an inner side wall surface of at least one of the other confinement rings.

According to another aspect of the present invention, the upper confinement ring has an inner diameter that is larger than that of the lower confinement ring, and the vertically extending inner wall of a lower confinement ring confronts and is spaced from an inner side wall surface of the upper confinement ring. Thus, the vertically extending inner wall prevents plasma within the process chamber from penetrating into a gap between the upper confinement ring and the lower confinement ring According to still another aspect of the present invention, the bottommost lower confinement ring has the vertically extending inner wall, and the upper confinement ring and at least one other lower confinement ring each have an inner diameter that is larger than that of the bottommost lower confinement ring. The vertically extending inner wall of the bottommost lower confinement ring confronts and is spaced from inner side wall surfaces of each other lower confinement ring and the upper confinement ring. Thus, the vertically extending inner wall of the bottommost lower confinement ring prevents plasma within the process chamber from penetrating into respective gaps between the lower confinement rings and between an uppermost one of the lower confinement rings and the upper confinement ring.

According to yet another aspect of the present invention, a plurality of sets of confinement rings are disposed one above the other in the assembly. Each of the sets of the confinement rings include a lowermost one of the lower confinement rings and at least two other confinement rings disposed above the lowermost one of the lower confinement rings. Each of the at least two other confinement rings has an inner diameter larger than that of the lowermost one of lower confinement rings in the set. Also, the lowermost one of the lower confinement rings has the vertically extending inner wall, and the vertically extending inner wall confronts and is spaced from inner side wall surfaces of the other confinement rings of the set. Thus, the vertically extending inner wall prevents plasma within the process chamber from penetrating into respective gaps between the lowermost one of the lower confinement rings and the at least two other confinement rings in each of the sets.

The confinement ring assembly also has a quartz or ceramic ring engaged with the bushing of each of the plungers along with the upper confinement ring and disposed above the upper confinement ring. Preferably, the upper surface of the inner vertically extending wall of a lower confinement ring confronts and is spaced from the bottom surface of the quartz or ceramic ring.

BRIEF DESCRIPTION OF THE DRAWINGS

The above and other objects, features and advantages of the present invention will become more apparent to those of ordinary skill in the art by referring to the following detailed description of the preferred embodiments thereof made with reference to the attached drawings in which.

DETAILED DESCRIPTION OF THE PREFERRED EMBODIMENTS

Figure 1:
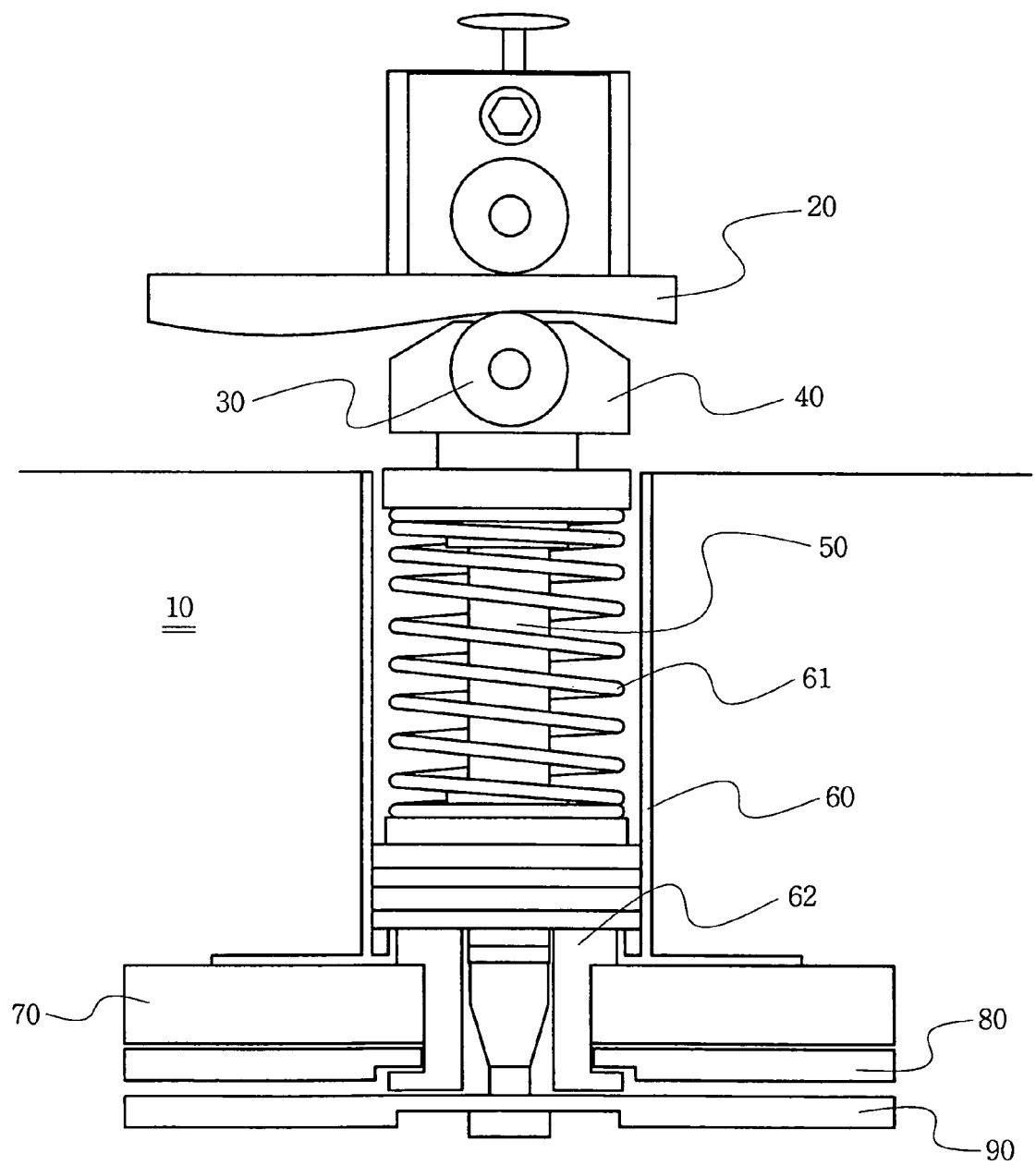
FIG. 1 is a sectional view of an upper portion of a plasma processing apparatus, illustrating one segment of a conventional confinement ring assembly of the apparatus.
Figure 2:
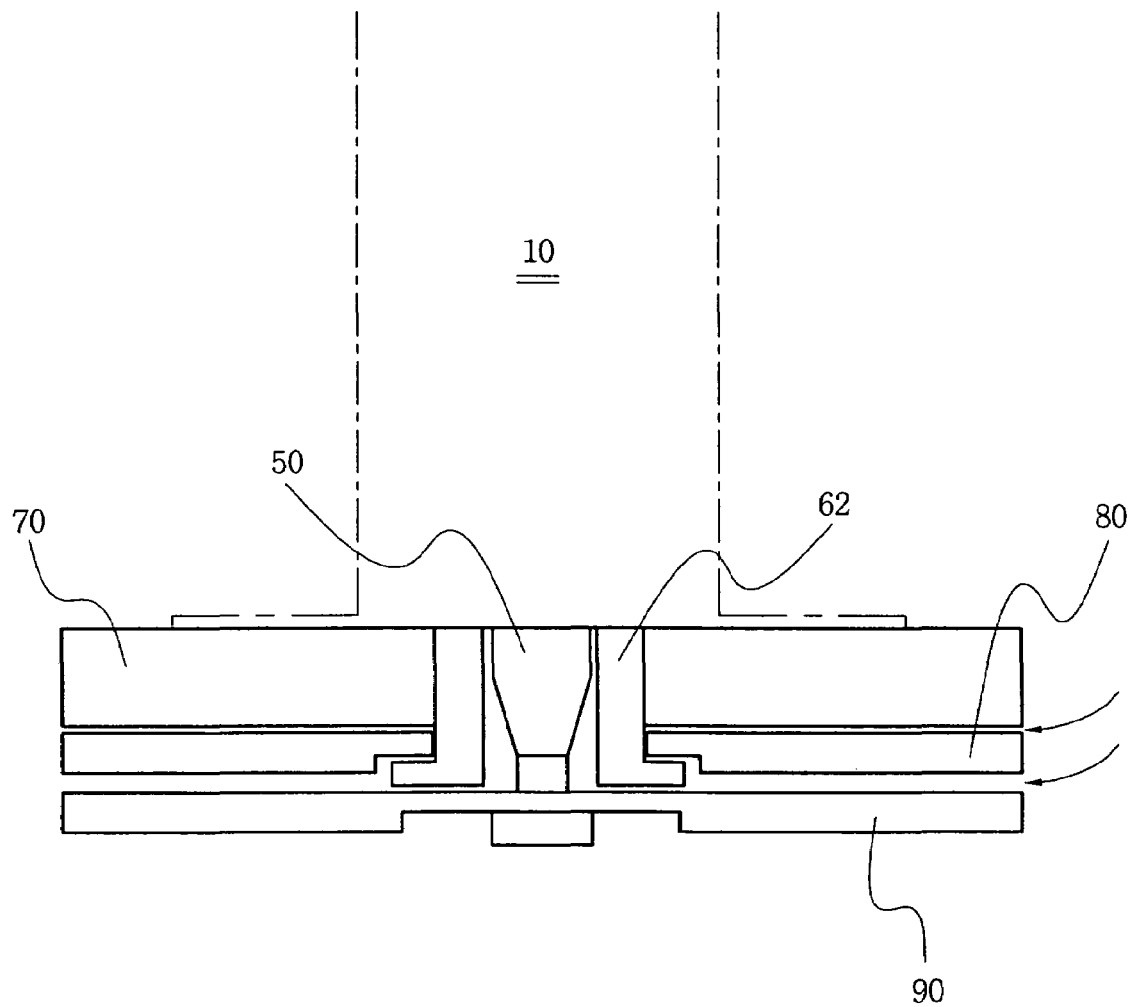
FIG. 2 is a cross-sectional view of a portion of the confinement ring assembly of the conventional plasma processing apparatus, showing the relationship between the quartz ring and confinement rings of the assembly.

The preferred embodiments of the present invention will now be described in more detail with reference to FIGS. 3-7. In this respect, like reference numerals are used to designate like elements throughout the drawings. In addition, the elements of the confinement ring assembly of the present invention which are essentially the same as those of the conventional assembly shown in FIG. 1 are omitted from FIGS. 3-7 for the sake of clarity.

Figure 3:
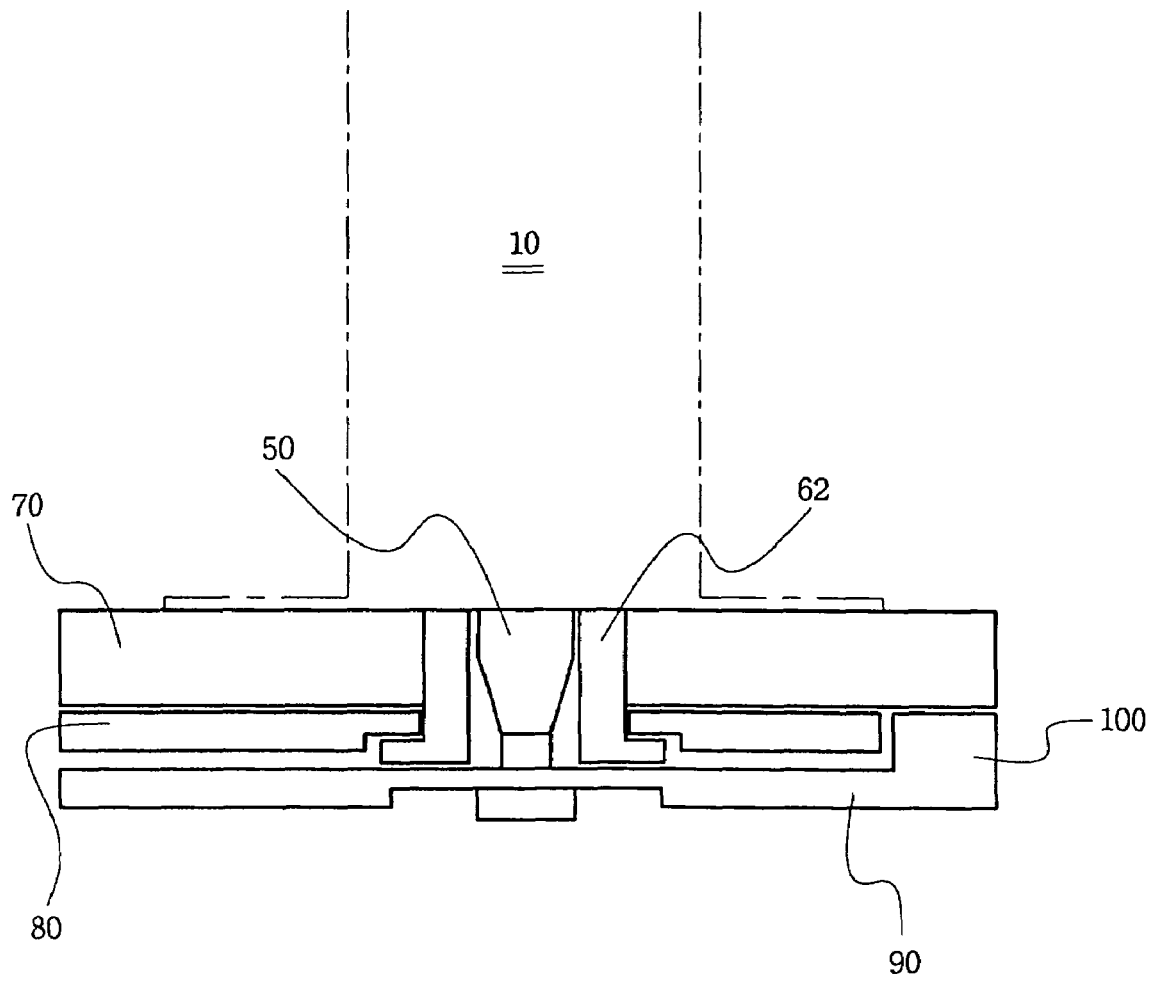
FIG. 3 is a cross-sectional view of a portion of a first embodiment of the confinement ring assembly according to the present invention, showing the relationship between the quartz ring and confinement rings of the assembly.

FIG. 3 shows an essential portion of a first preferred embodiment of a confinement ring assembly of a plasma processing apparatus according to the present invention. The confinement ring assembly (again, refer back to FIG. 1) includes a cam ring (20 in FIG. 1) disposed above the process chamber of the apparatus, and a drive means for rotating the cam ring. A plurality of plungers are disposed below the cam ring as spaced from each other by predetermined angular intervals. Each plunger includes a roller (30), a bearing block (40) to which the axle of the roller is attached, a rod 50 engaged with the bearing block (40), a cylinder (60) through which the rod 50 extends, a spring (61) biasing the roller (30) into engagement with the cam surface of the cam ring (20), and a bushing 62 fixed to the cylinder (60) and through which the rod 50 extends.

The confinement ring assembly according to the present invention also includes a quartz ring 70 firmly engaged with the bottom surfaces of the cylinders of the plungers, and an upper confinement ring 80 disposed under the quartz ring 70. The bushing 62 of each plunger is fitted to the quartz ring 70 and the upper confinement ring 80 at portions thereof through which the rod 50 of the plunger passes. That is, bushing 62 provides a passageway through the quartz ring 70 and the upper confinement ring 80 to prevent friction from being created between the rod 50 and each of the quartz ring 70 and the upper confinement ring 80.

The confinement ring assembly also includes a lower confinement ring 90 disposed below the upper confinement ring 80 and coupled to the lower end of the rod (50) of each plunger. For instance, the lower end of the rod 50 is threaded to receive a nut that secures the lower confinement ring 90 to the end of the rod 50. However, unlike the conventional assembly, the inner diameter of the upper confinement ring 80 is larger than that of the lower confinement ring 90. Furthermore, the lower confinement ring 90 has an outer peripheral portion whose upper surface confronts the bottom surface the upper confinement ring 80, and an inner peripheral portion 100 that projects upwardly relative to the upper surface of the outer peripheral portion. Moreover, the inner peripheral portion of the lower confinement ring 90 is spaced radially inwardly from the inner peripheral portion of the upper confinement ring 80 and has an outer side surface that faces an inner side surface of the upper confinement ring 80. In other words, the inner peripheral portion of the lower confinement ring 90 forms an inner wall 100 in front of the upper confinement ring 80 with respect to the space in which the plasma is formed.

Figure 4:
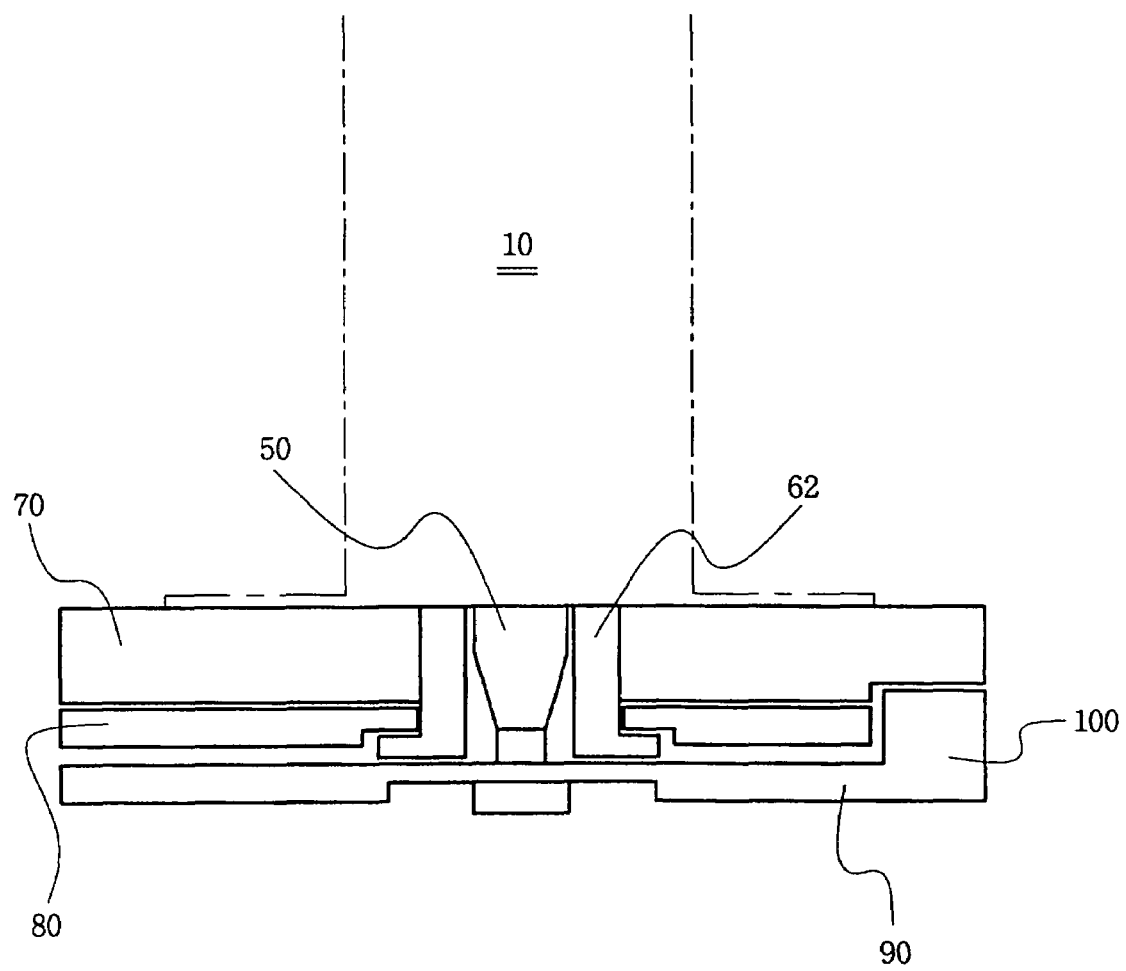
FIG. 4 is a cross-sectional view of a portion of a modified form of the first embodiment of the confinement ring assembly according to the present invention.

The upper surface of the inner wall 100 is preferably disposed level with the upper surface of the upper confinement ring 80 when the rod 50 of the plunger is at its uppermost position. However, the upper surface of the inner wall 100 may be disposed above the level of the upper surface of the upper confinement ring 80 as long as the wall 100 does not contact the bottom surface of the quartz ring 70. For instance, as shown in the embodiment of FIG. 4, the bottom of the inner peripheral portion of the quartz ring 70 disposed above the inner wall 100 can be recessed. The recess has a width greater than that of the inner wall 100 so that the upper portion of the inner wall 100 is located at the same height as or above the bottom surface of the quartz ring 70.

In either case, the inner wall 100 prevents plasma from penetrating into the gap between the lower confinement ring 90 and the upper confinement ring 80. Furthermore, if the upper end surface of the inner wall 100 is disposed above the level of the upper surface of the lower confinement ring 80, the inner wall 100 also prevents plasma from penetrating into the gap between the upper confinement ring 80 and the quartz 70.

Figure 5:
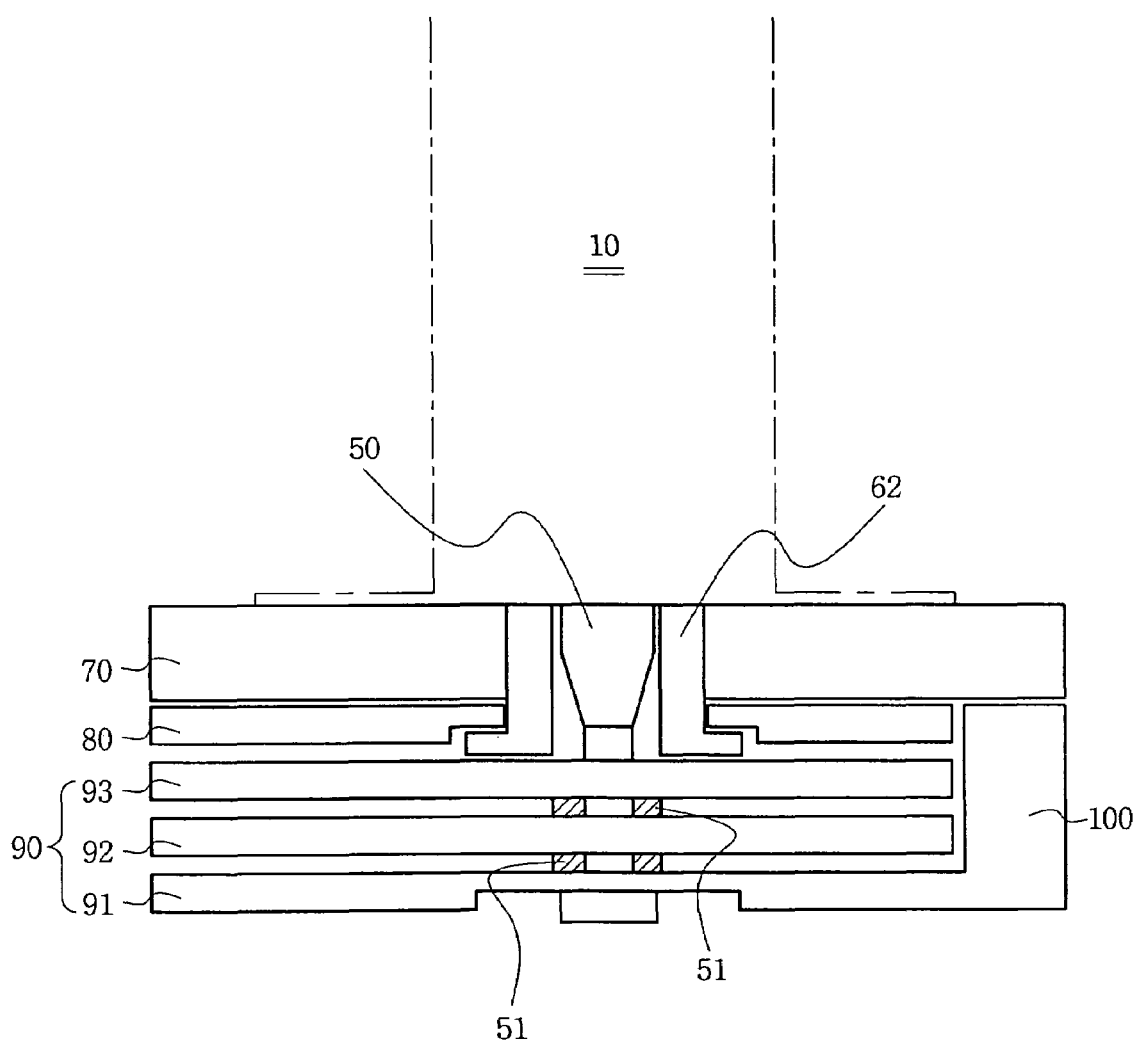
FIG. 5 is a cross-sectional view of a portion of another embodiment of a confinement ring assembly according to the present invention, showing the relationship between the quartz ring and confinement rings of the assembly.

FIG. 5 shows another preferred embodiment of a confinement ring assembly of a plasma treatment apparatus according to the present invention. The confinement assembly includes a plurality of lower confinement rings 90 but is otherwise similar to the previously described embodiments. In particular, the confinement ring assembly includes a quartz ring 70 fitted to the bushing 62 of and fixed to the cylinder (60), an upper confinement ring 80 fitted to the bushing 62 together with the quartz ring 70, and a plurality of lower confinement rings 91, 92 and 93. The bottommost lower confinement ring 91 is threaded to the lower end of the rod 50 of the plunger. The other lower confinement rings 92 and 93 are disposed above the lower confinement ring 91 and the lower confinement rings 91, 92 and 93 are spaced from each other by annular spacers 51, respectively, which extend around the rod 50.

In this embodiment, all of the confinement rings except for the bottommost lower confinement ring 91 have inner diameters that are larger than that of the bottommost lower confinement ring 91. The inner peripheral portion of the bottommost lower confinement ring 91 extends upwardly to form an inner wall 100. The inner wall 100 faces and is spaced from inner side wall surfaces of the confinement rings 80, 92, and 93 such that a gap is defined therebetween.

On the other hand, the upper surface of the inner wall 100 of the bottommost lower confinement ring 91 is spaced from the bottom surface of the quartz ring 70 so that a gap is left between the upper surface of the inner wall 100 and the bottom surface of the quartz ring 70. However, like the embodiment of FIG. 4, the bottom of the inner peripheral portion of the quartz ring 70 located above the inner wall 100 can have a recess therein and which recess has a width greater than that of the inner wall 100. Accordingly, the upper surface of the inner wall 100 may be disposed at the same height as or above the level of the bottom surface of the quartz ring 70.

In any case, the inner wall 100 prevents plasma from penetrating into the gaps between the lower confinement rings 91, 92, and 93 and between the uppermost lower confinement ring 93 and the upper confinement ring 80. Furthermore, if the upper surface of the inner wall 100 is disposed at the same level as or above the level of the bottom surface of the quartz ring 70, the inner wall 100 will also prevent plasma from penetrating into the gap between the upper confinement ring 80 and the quartz ring 70.

Figure 6:
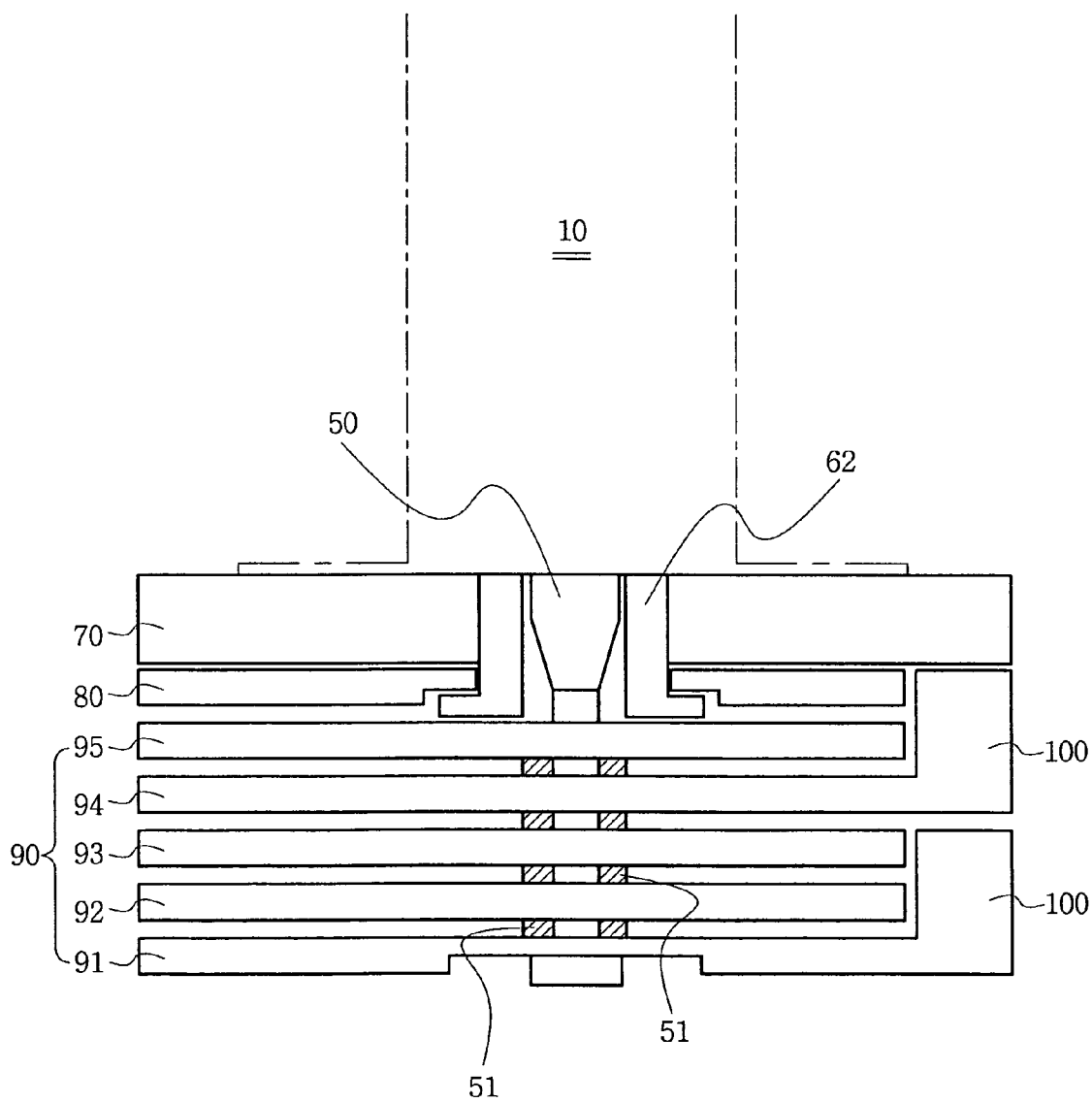
FIG. 6 is a cross-sectional view of a portion of yet another embodiment of a confinement ring assembly according to the present invention, showing the relationship between the quartz ring and confinement rings of the assembly.

FIG. 6 shows another embodiment of a confinement ring assembly of a plasma treatment apparatus according to the present invention. The confinement ring assembly includes a plurality of lower confinement rings 90, like the previous embodiment, and is otherwise similar to the previously described embodiments. That is, the confinement assembly includes a cam ring (20), and several plungers each comprising a roller (30), a bearing block (40) to which the axle of the roller is attached, a rod 50 engaged with the bearing block (40), a cylinder (60) through which the rod 50 extends, a spring (61) biasing the roller (30) into engagement with the cam surface of the cam ring (20), and a bushing 62 fixed to the cylinder (60) and through which the rod 50 extends. The confinement ring assembly also includes a quartz ring 70 fixed to the cylinder (60) of each plunger, and an upper confinement ring 80 fitted to the bushing 62 together with the quartz ring 70.

However, the confinement rings include a first (lower) set of confinement rings 91, 92, 93, and a second (upper) set of confinement rings 80, 94, 95 disposed above the first (lower) set of confinement rings 91, 92, 93. The bottommost lower confinement ring 91 is coupled to the lower end of the rod 50. For instance, as previously described, the lower end of the rod 50 may be threaded and a nut is engaged therewith to secure the bottommost lower confinement ring 91 to the rod 50. Also, the lower confinement rings 90 are spaced along the rod 50 from each other by annular spacers 51, respectively, which extend around the rod 50.

Moreover, as shown in FIG. 6, each set includes at least two confinement rings 92, 93 or 80, 95 having substantially the same inner diameter, and one lowermost lower confinement ring 91 or 94 having an inner peripheral portion that extends upwardly to form an inner wall 100. The inner diameter of the confinement rings 80, 92, 93, 95 is larger than the inner diameter of the lower confinement rings 91 and 94. Thus, the inner wall 100 of the lower confinement ring 91 or 94 of each set faces and is spaced from the side wall surfaces of the other lower confinement rings 92, 93 or 80, 95 in each set. Furthermore, the upper surface of the inner wall 100 of the lower confinement ring 94 confronts and is spaced from the bottom surface of the quartz ring 70.

Figure 7:
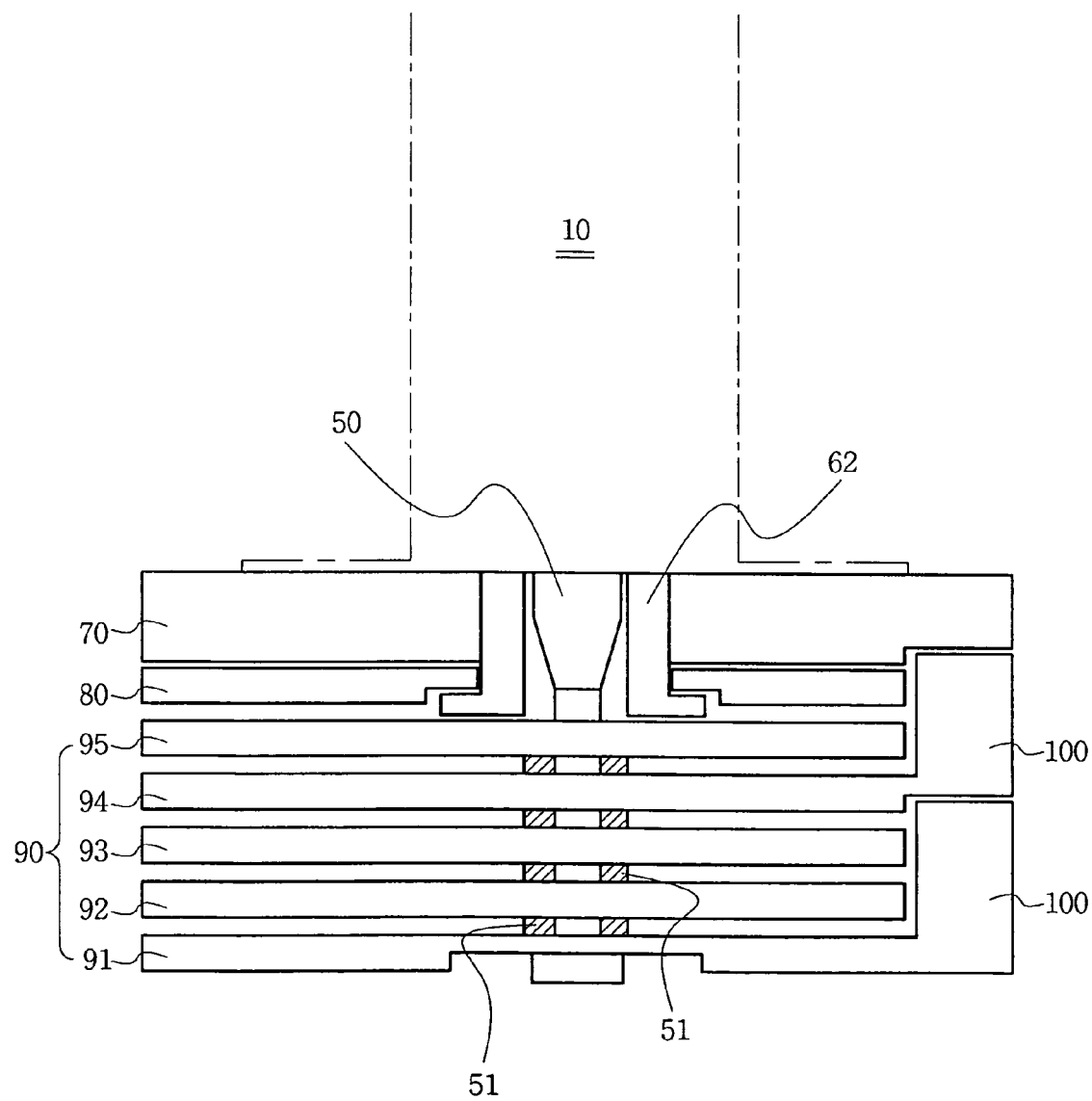
FIG. 7 is a cross-sectional view of a portion of a modified form of the embodiment of the confinement ring assembly shown in FIG. 6.

In the modified form shown in FIG. 7, the bottom of the inner peripheral portion of the quartz ring 70 disposed above the inner wall 100 of the lower confinement ring 94 is recessed. The recess has a width greater than that of the inner wall 100 so that the upper portion of the inner wall 100 is located at the same height as or above the bottom surface of the quartz ring 70. Likewise, the bottom of the inner peripheral portion of the lower confinement ring 94 disposed above the inner wall 100 of the bottommost lower confinement ring 91 is recessed. This recess has a width greater than that of the inner wall 100 of the bottommost lower confinement ring 91 so that the upper portion of the inner wall 100 is located at the same height as or above the bottom surface of the lower confinement ring 94.

The inner walls 100 of the lower confinement rings 91 and 94 prevent plasma from penetrating into the gaps between the lower confinement rings 91, 92, and 93, and into the gaps between the lower confinement rings 94 and 95 and the upper confinement ring 80. Furthermore, if the upper surface of the inner wall 100 of the lower confinement ring 94 is disposed at the same level as or above the level of the bottom surface of the quartz ring 70, plasma is prevented form being introduced into the gap between the upper confinement ring 80 and the quartz ring 70. Similarly, if the upper surface of the inner wall 100 of the lower confinement ring 91 is disposed at the same level as or above the level of the bottom surface of the lower confinement ring 94, plasma is prevented form being introduced into the gap between the lower confinement ring 93 and the lower confinement ring 94.

Figure 8:
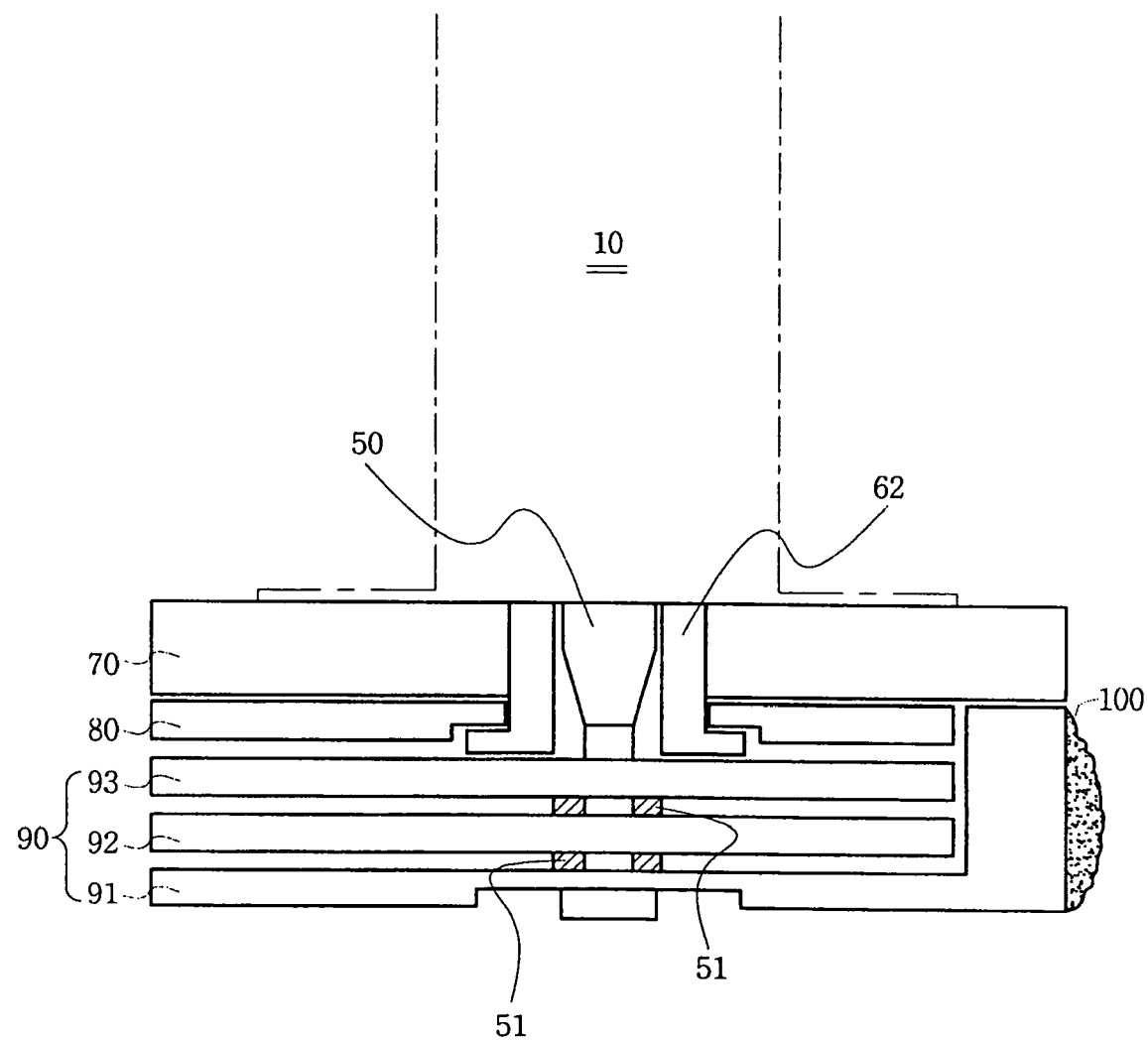
FIG. 8 is a cross-sectional of part of a confinement ring assembly according to the present invention, illustrating a state in which polymer is bonded to the vertically extending inner wall of a lower confinement ring.

In each of the embodiments of the present invention, the inner wall(s) 100 provides a relatively large surface(s) to which polymer can adhere while a substrate such as a semiconductor wafer is being processed in the processing chamber. As a result, as shown in FIG. 8, the forces by which the polymer adheres to the confinement ring assembly are relatively strong. Thus, the confinement ring assembly minimizes or prevents the contamination of the wafer so that the process will yield high quality products on a consistent basis.

Also, as mentioned above, according to the present invention, the inner wall(s) of lower confinement ring(s) prevent plasma from penetrating into the gaps between the confinement rings 80 and 90. An inner wall of a lower confinement ring can also prevent plasma from penetrating into a gap between the upper confinement ring 80 and the quartz ring 70. Therefore, there is no loss of plasma along from the region of the process chamber surrounded by the confinement rings. Thus, the plasma process is carried out accurately and with maximum efficiency.

Finally, although the present invention has been specifically described above in connection with the preferred embodiments thereof, the present invention is not so limited. For example, the ring 70 has been described above as being made of quartz, as in the prior art. However, the ring 70 is preferably made of ceramic so as to better facilitate the forming of the recess which confronts the upper surface of the inner wall 100 of a lower confinement ring. Therefore, the true spirit and scope of the present invention is not limited to the detailed description of the preferred embodiments but by the appended claims.

What is claimed is:

1. In a plasma processing apparatus having a process chamber in which substrates are processed with plasma, a confinement ring assembly comprising:
a plurality of plungers disposed about the process chamber, and a plurality of confinement rings, each of the plungers including a cylinder, a rod extending vertically through the cylinder and supported so as to be movable up and down in the apparatus, a bushing fixed to a lower end portion of the cylinder and through which the rod extends, and
wherein the confinement rings include an upper confinement ring fitted to the bushing of each of the plungers, and a lower confinement ring coupled to a lower end of the rod of each of the plungers so as to move up and down therewith, the upper confinement ring having an inner diameter that is larger than that of the lower confinement ring, and the lower confinement ring having an inner peripheral portion that extends upwardly relative to an outer peripheral portion thereof to form a vertically extending inner wall, the vertically extending inner wall of the lower confinement ring confronting and spaced from an inner side wall surface of the upper confinement ring, whereby the vertically extending inner wall prevents plasma generated while a process is being performed within the process chamber from penetrating into a gap between the upper confinement ring and the lower confinement ring.

2. The confinement ring assembly in a plasma processing apparatus according to claim 1, further comprising a quartz or ceramic ring engaged with the bushing of each of the plungers along with the upper confinement ring and disposed above the upper confinement ring, and wherein the upper surface of the inner vertically extending wall of the lower confinement ring confronts and is spaced from the bottom surface of the quartz or ceramic ring.

3. The confinement ring assembly in a plasma processing apparatus according to claim 2, wherein the quartz or ceramic ring has an annular recess in the bottom thereof, the recess extending along the inner periphery of the bottom of the quartz or ceramic ring, and the recess having a width greater than that of the vertically extending inner wall of the lower confinement ring, and the upper surface of the vertically extending inner wall opposing a surface of said quartz or ceramic ring that defines the bottom of the recess, whereby the upper surface of the vertically extending inner wall can be situated at the same level as or above the level of the bottom surface of the quartz or ceramic ring.

4. In a plasma processing apparatus having a process chamber in which substrates are processed with plasma, a confinement ring assembly comprising:
a plurality of plungers disposed about the process chamber, and a plurality of confinement rings, each of the plungers including a cylinder, a rod extending vertically through the cylinder and supported so as to be movable up and down in the apparatus, and a bushing fixed to a lower end portion of the cylinder and through which the rod extends, and
wherein the plurality of confinement rings include an upper confinement ring fitted to the bushing of each of the plungers, and a plurality of lower confinement rings disposed one above the other on and coupled to a lower end of the rod of each of the plungers so as to move up and down therewith, whereby the lower confinement rings include a bottommost lower confinement ring and at least one other lower confinement ring disposed above the bottommost lower confinement ring, each said at least one other lower confinement ring and the upper confinement ring having an inner diameter larger than that of the bottommost lower confinement ring, and the bottommost lower confinement ring having art inner peripheral portion that extends upwardly relative to an outer peripheral portion thereof to form a vertically extending inner wall, the vertically extending inner wall of the bottommost lower confinement ring confronting and spaced from side wall surfaces of each said at least one other lower confinement ring and the upper confinement ring, whereby the vertically extending inner wall prevents plasma generated while a process is being performed within the process chamber from penetrating into respective gaps between the lower confinement rings and between an upper most one of the lower confinement rings and the upper confinement ring.

5. The confinement ring assembly in a plasma processing apparatus according to claim 4, further comprising a quartz or ceramic ring engaged with the bushing of each of the plungers along with the upper confinement ring and disposed above the upper confinement ring, and wherein the upper surface of the inner vertically extending wall of the bottommost lower confinement ring confronts and is spaced from the bottom surface of the quartz or ceramic ring.

6. The confinement ring assembly in a plasma processing apparatus according to claim 5, wherein the quartz or ceramic ring has an annular recess in the bottom thereat the recess extending along the inner periphery of the bottom of the quartz or ceramic ring, and the recess having a width greater than that of the vertically extending inner wall of the bottommost lower confinement ring, and the upper surface of the vertically extending inner wall opposing a surface of said quartz or ceramic ring that defines the bottom of the recess, whereby the upper surface of the vertically extending inner wall can be situated at the same level as or above the level of the bottom surface of the quartz or ceramic ring.

7. In a plasma processing apparatus having a process chamber in which substrates are processed with plasma, a confinement ring assembly comprising:
a plurality of plungers disposed about the process chamber, and a plurality of sets of confinement rings disposed one above the other in the assembly, each of the plungers including a cylinder, a rod extending vertically through the cylinder and supported so as to be movable up and down in the apparatus, and a bushing fixed to a lower end portion of the cylinder and through which the rod extends, and wherein the confinement rings include an upper confinement ring fitted to the bushing of each of the plungers, and lower confinement rings each coupled to the rod of each of the plungers so as to move up and down therewith, and each of the sets of the confinement rings include a lowermost one of the lower confinement rings in the set and at least two other confinement rings disposed above the lowermost one of the lower confinement rings, each of the at least two other confinement rings having an inner diameter larger than that of the lowermost one of lower confinement rings in the set, and the lowermost one of the lower confinement rings having an inner peripheral portion that extends upwardly relative to an outer peripheral portion thereof to form a vertically extending inner wall, the vertically extending inner wall of the lowermost one of the lower confinement rings confronting and spaced from side wall surfaces of each of the at least two other confinement rings of the set, whereby the vertically extending inner wall prevents plasma generated while a process is being performed within the process chamber from penetrating into respective gaps between the lowermost one of the lower confinement rings and the at least two other confinement rings in each of the sets.

8. The confinement ring assembly in a plasma processing apparatus according to claim 7, further comprising a quartz or ceramic ring engaged with the bushing of each of the plungers along with the upper confinement ring, and wherein the sets of confinement rings include a lower set of the confinement rings and an upper set of the confinement rings, the upper set of the confinement rings including the upper confinement ring.

9. The confinement ring assembly in a plasma processing apparatus according to claim 8, wherein the upper surface of the inner vertically extending wall of the lowermost one of the lower confinement rings of the upper set confronts and is spaced from the bottom surface of the quartz or ceramic ring, and the upper surface of the inner vertically extending wall of the lowermost one of the lower confinement rings of the lower set confronts and is spaced from the bottom surface of the lowermost one of the lower confinement rings of the upper set.

10. The confinement ring assembly of a plasma processing apparatus according to claim 9, wherein the quartz or ceramic ring has an annular recess in the bottom thereof, the recess extending along the inner periphery of the bottom of the quartz or ceramic ring, and the recess having a width greater than that of the vertically extending inner wall of the lowermost one of the lower confinement rings of the upper set, and the upper surface of the vertically extending inner wall of the lowermost one of the lower confinement rings of the upper set opposing a surface of said quartz or ceramic ring that defines the bottom of the recess, whereby the upper surface of the vertically extending inner wall of the lowermost one of the lower confinement rings of the upper set can be situated at the same level as or above the level of the bottom surface of the quartz or ceramic ring.

11. The confinement ring assembly of a plasma processing apparatus according to claim 9, wherein the lowermost one of the lower confinement rings of the upper set has an annular recess in the bottom thereof, the recess extending along the inner periphery of the bottom of the lowermost one of the lower confinement rings of the upper set, and the recess having a width greater than that of the vertically extending inner wall of the lowermost one of the lower confinement rings of the lower set, and the upper surface of the vertically extending inner wall of the lowermost one of the lower confinement rings of the lower set opposing a surface of said lowermost one of the lower confinement rings of the upper set that defines the bottom of the recess, whereby the upper surface of the vertically extending inner wall of the lowermost one of the lower confinement rings of the lower set can be situated at the same level as or above the level of the bottom surface of the lowermost one of the lower confinement rings of the upper set.

12. The confinement ring assembly of a plasma processing apparatus according to claim 10, wherein the lowermost one of the lower confinement rings of the upper set has a second annular recess in the bottom thereof, the second recess extending along the inner periphery of the bottom of the lowermost one of the lower confinement rings of the upper set, and the second recess having a width greater than that of the vertically extending inner wall of the lowermost one of the lower confinement rings of the lower set, and the upper surface of the vertically extending inner wall of the lowermost one of the lower confinement rings of the lower set opposing a surface of said lowermost one of the lower confinement rings of the upper set that defines the bottom of the second recess, whereby the upper surface of the vertically extending inner wall of the lowermost one of the lower confinement rings of the lower set can be situated at the same level as or above the level of the bottom surface of the lowermost one of the lower confinement rings of the upper set.

13. In a plasma processing apparatus having a process chamber in which substrates are processed with plasma, a confinement ring assembly comprising:
a plurality of plungers disposed about the process chamber, a plurality of confinement rings, each of the plungers including a cylinder, a rod extending vertically through the cylinder and supported so as to be movable up and down in the apparatus, and a bushing fixed to a lower end portion of the cylinder and through which the rod extends, and
wherein the confinement rings include an upper confinement ring fitted to the bushing of each of the plungers, and at least one lower confinement ring coupled to a lower end of the rod of each of the plungers so as to move up and down therewith, at least one of the confinement rings having an inner diameter that is larger than that of a lower confinement ring, and said lower confinement ring having an inner peripheral portion that extends upwardly relative to an outer peripheral portion thereof to form a vertically extending inner wall, the vertically extending inner wall of said lower confinement ring confronting and spaced from an inner side wall surface of each said at least one of the confinement rings.

14. The confinement ring assembly in a plasma processing apparatus according to claim 13, further comprising a quartz or ceramic ring engaged with the bushing of each of the plungers along with the upper confinement ring and disposed above the upper confinement ring, and wherein the upper surface of the inner vertically extending wall of the lower confinement ring confronts and is spaced from the bottom surface of the quartz or ceramic ring.

* * * * *